(12) United States Patent
Djordjevic et al.

(10) Patent No.: US 8,234,538 B2
(45) Date of Patent: *Jul. 31, 2012

(54) ULTRA HIGH-SPEED OPTICAL TRANSMISSION BASED ON LDPC-CODED MODULATION AND COHERENT DETECTION FOR ALL-OPTICAL NETWORK

(75) Inventors: Ivan B. Djordjevic, Tucson, AZ (US); Milorad Cvijetic, Herndon, VA (US); Lei Xu, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 1163 days.

This patent is subject to a terminal disclaimer.

(21) Appl. No.: 11/941,747

(22) Filed: Nov. 16, 2007

(65) Prior Publication Data
US 2008/0294968 A1 Nov. 27, 2008

Related U.S. Application Data

(60) Provisional application No. 60/914,171, filed on Apr. 26, 2007.

(51) Int. Cl.
*H03M 13/00* (2006.01)
(52) U.S. Cl. ............... 714/755; 714/786; 714/781

(58) Field of Classification Search .......... 714/781, 714/755, 786
See application file for complete search history.

(56) References Cited

U.S. PATENT DOCUMENTS

| 7,992,070 B2 * | 8/2011 | Djordjevic et al. ......... 714/755 |
| 2006/0120474 A1 | 6/2006 | Hong |
| 2006/0182199 A1 | 8/2006 | Hong |
| 2006/0251164 A1 | 11/2006 | Visoz |

OTHER PUBLICATIONS

Caire et al., Bit-Interleaved Coded Modulation, IEEE Transactions on Info. Theory, vol. 44, No. 3, May 1998.
I. B. Djordjevic, and B. Vasic: Multilevel coding in M-ary DPSK/differential QAM high-speed optical transmission with direct detection, J. Light-wave Technol., vol. 24, pp. 420-428, Jan. 2006.
I. B. Djordjevic, M. Cvijetic, L. Xu, and T. Wang: Proposal for beyond 100 Gb/s optical transmission based on bit-interleaved LDPC-coded modulation, IEEE Photon. Technol. Let., Jun. 2007.
Ten Brink, Stephan, Designing Iterative Decoding Schemes with the Extrinsic Info. Transfer Chart, Int. J. Electron. Comm. 54 (2000), No. 6, 389-398.

* cited by examiner

*Primary Examiner* — Guy Lamarre
(74) *Attorney, Agent, or Firm* — Bao Tran; Joseph Kolodka

(57) ABSTRACT

An optical communication system includes a bit-interleaved coded modulation (BICM) coder; and a low-density parity-check (LDPC) coder coupled to the BICM coder to generate codes used as component codes and in combination with a coherent detector.

21 Claims, 7 Drawing Sheets

64-QAM:

ULTRA HIGH-SPEED OPTICAL TRANSMISSION BASED ON LDPC-CODED MODULATION AND COHERENT DETECTION FOR ALL-OPTICAL NETWORK

The present application claims priority to U.S. Provisional Application Ser. No. 60/914,171, filed Apr. 26, 2007, the content of which is incorporated by reference.

The present invention relates to coding systems for optical transmission.

BACKGROUND

Light has an enormous potential for data transmission with very high data rates. This is basically a consequence of the high optical frequencies, which also allow optical systems to have very broad bandwidths. For example, the wavelength range from 1.3 µm to 1.6 µm, which may be transmitted through an optical fiber, corresponds to a bandwidth as large as 43 THz, which is orders of magnitude higher than that of any electrical cable. This capability is being tapped to serve unprecedented rate of Internet traffic growth, which needs deployment of optical transmission systems with bit rates higher than rate of currently available 40 Gb/s systems. However, at those data rates, such as 100 Gb/s, signal quality is significantly degraded mainly due to impact of polarization mode dispersion (PMD), and intra-channel nonlinear effects. Although, the main components related to electrically time-division multiplexed (ETDM) transceivers operating at 100 Gb/s are becoming commercially available, they are still expensive. On the other hand, there is a possibility to use commercially available components operating at lower speed as an alternative approach to enable transmission at 100 Gb/s and beyond.

SUMMARY

In a first aspect, an optical communication system includes a bit-interleaved coded modulation (BICM) coder; and a low-density parity-check (LDPC) coder coupled to the BICM coder to generate codes used as component codes and in combination with a coherent detector.

In another aspect, a method performs optical communication by applying bit-interleaved coded modulation (BICM) coding and a low-density parity-check (LDPC) coding generate codes used as component codes to generate a BI-LDPC code modulation to be received by a coherent detector.

Implementations of the above aspects can include one or more of the following. The LDPC encoders can have identical (n,k) LDPC codes of code rate r=k/n, wherein k is the number of information bits and n is the codeword length. A block interleaver can be connected to the LDPC encoder and the LDPC encoder outputs can be written to the block-interleaver row-wise. A mapper can be connected to the block interleaver. The block interleaver can be an (m×n) interleaver and the mapper can accept m bits, $c=(c_1, c_2, \ldots, c_m)$, at time instance i from the (m×n) interleaver column-wise and determines a corresponding M-ary ($M=2^m$) constellation point. A coherent detector receiver can receive the BI-LDPC coded modulation. The coherent transmitter can send data phasor $\phi_i \in \{0, 2\pi/M, \ldots, 2\pi(M-1)/M\}$ at each $i^{th}$ transmission interval. A direct detection version can be used that performs differential encoding on a transmitter side and sends a data phasor $\phi_i = \phi_{i-1} + \Delta\phi_i$, where $\Delta\phi_i \in \{0, 2\pi/M, \ldots, 2\pi(M-1)/M\}$ each $i^{th}$ transmission interval. An a posteriori probability (APP) demapper block can be used, and a log-likelihood ratio (LLR) module can be connected to the APP demapper block. One or more LDPC decoders can be connected to the LLR module.

Advantages of preferred embodiments of the invention may include one or more of the following. In one embodiment, modulation, coding, and multiplexing are performed in a unified fashion, which means that transmission, and all signal processing related to detection and decoding are effectively done at much lower symbol rates (e.g. 40 Giga symbols/s). In such a way, dealing with the nonlinear effects and polarization-mode dispersion (PMD) is more manageable, while the aggregate data rate is maintained at or above 100 Gb/s. The above architecture can combined with coherent detection to gain an additional power margin to be used against impacts of networking effects in an all-optical network scenario.

BRIEF DESCRIPTION OF THE DRAWINGS

Further features and advantages of the present invention will become apparent to those skilled in the art with reference to the drawing in which:

FIG. 5 shows an exemplary constellation diagram for 8-QAM, while

DESCRIPTION

Figure 1:
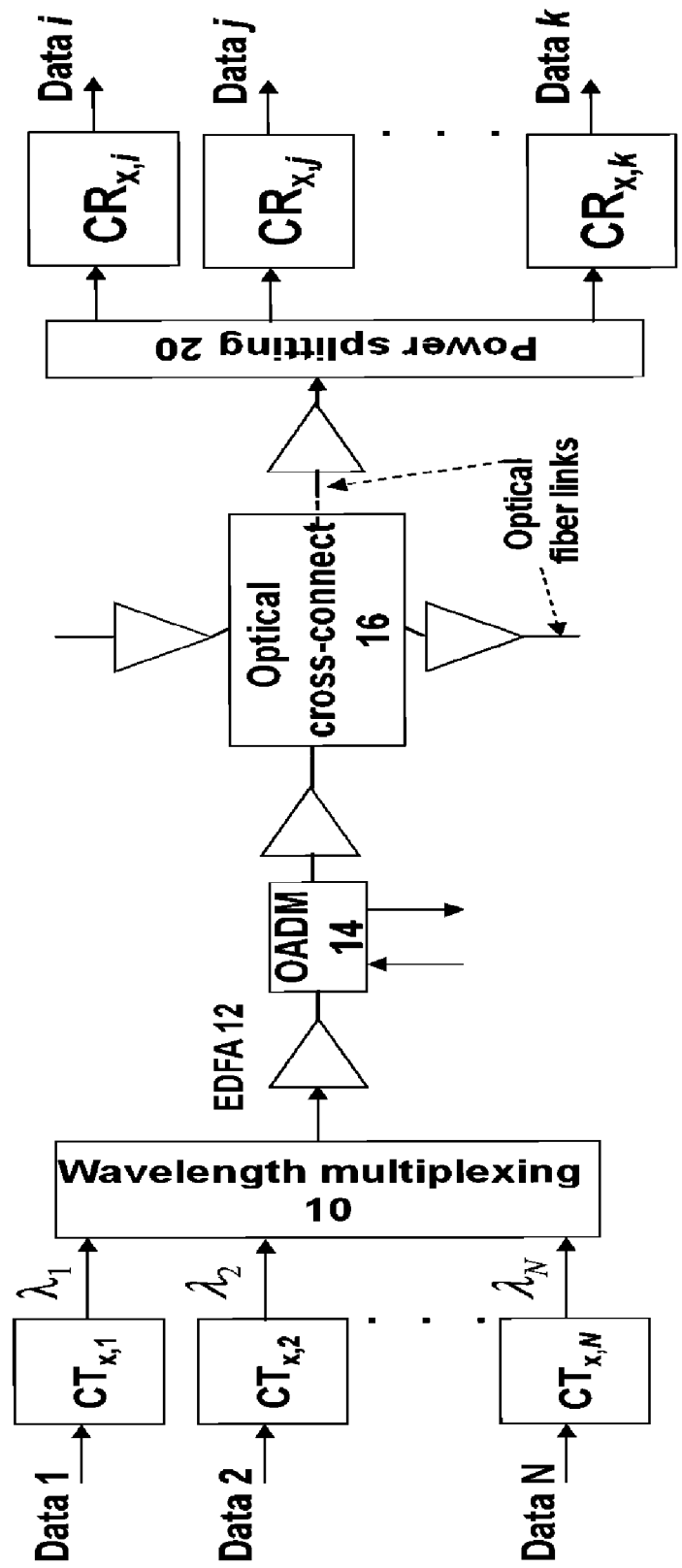
FIG. 1 shows an exemplary optical network.

Embodiments of the invention will be described with reference to the accompanying drawing figures wherein like numbers represent like elements throughout. Before embodiments of the invention are explained in detail, it is to be understood that the invention is not limited in its application to the details of the examples set forth in the following description or illustrated in the figures. The invention is capable of other embodiments and of being practiced or carried out in a variety of applications and in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

By way of further background, it is readily understood by those skilled in the art that because optical dense wavelength division multiplexed (DWDM) communication systems employ light at different wavelengths to carry data information for different channels, the total information-carrying capacity of a single optical fiber is increased by several orders of magnitude as compared with non-DWDM systems. As a result, such systems have found widespread adoption as the increasing demand for communication bandwidths have been accompanied by increased DWDM capacities from 622 Mb/s (OC-12), to 2.488 Gb/s (OC-48), and to 9.952 Gb/s (OC-192). Presently, communication systems can communicate at 40 Gb/s per DWDM channel. The coded modulation schemes discussed below enables 100+ Gb/s transmission by using commercially available components operating at 40 Gb/s.

Referring now to the figures, FIG. 1 shows an exemplary optical network that incorporates bit-interleaved coded modulation (BICM) in combination with the low-density parity-check (LDPC) codes that are used as component codes, and in combination with coherent detection scheme. In FIG. 1, data is sent through a plurality of $CT_x$ (Coherent Transmitter) based on BICM with LDPC component codes. The outputs from the coherent transmitters are received by a wavelength multiplexer 10. After going through fiber links and periodically deployed optical amplifiers such as EDFA 12, the information is sent to an OADM (optical add-drop multiplexer) and again goes through optical fiber links to an optical cross-connect unit 16. The information from the optical cross-connect unit 16, after going through the fiber links, is provided to a power splitter 20 and then subsequently is provided to a plurality of $CR_x$ (Coherent Receiver) based on iterative APP demapper and LDPC decoders, as discussed in more details below.

The coherent detection scheme outperforms the direct detection one and provides additional margin needed for application in an all-optical network scenario. In one embodiment, a 100+ Gb/s transmission capability is achieved by using commercially available components operating at lower speeds. The main element this network includes bit-interleaved coded modulation (BICM) scheme, as discussed in more details below, combined with low-density parity check (LDPC) codes as component codes. In one embodiment, modulation, coding, and multiplexing are performed in a unified fashion, which means that transmission, and all signal processing related to detection and decoding are effectively done at much lower symbol rates (e.g. 40 Giga symbols/s). In such a way, dealing with the nonlinear effects and polarization-mode dispersion (PMD) is more manageable, while the aggregate data rate is maintained at or above 100 Gb/s. The architecture of FIG. 1 can be combined with coherent detection to gain an additional power margin to be used against impacts of networking effects in an all-optical network scenario.

Figure 2:
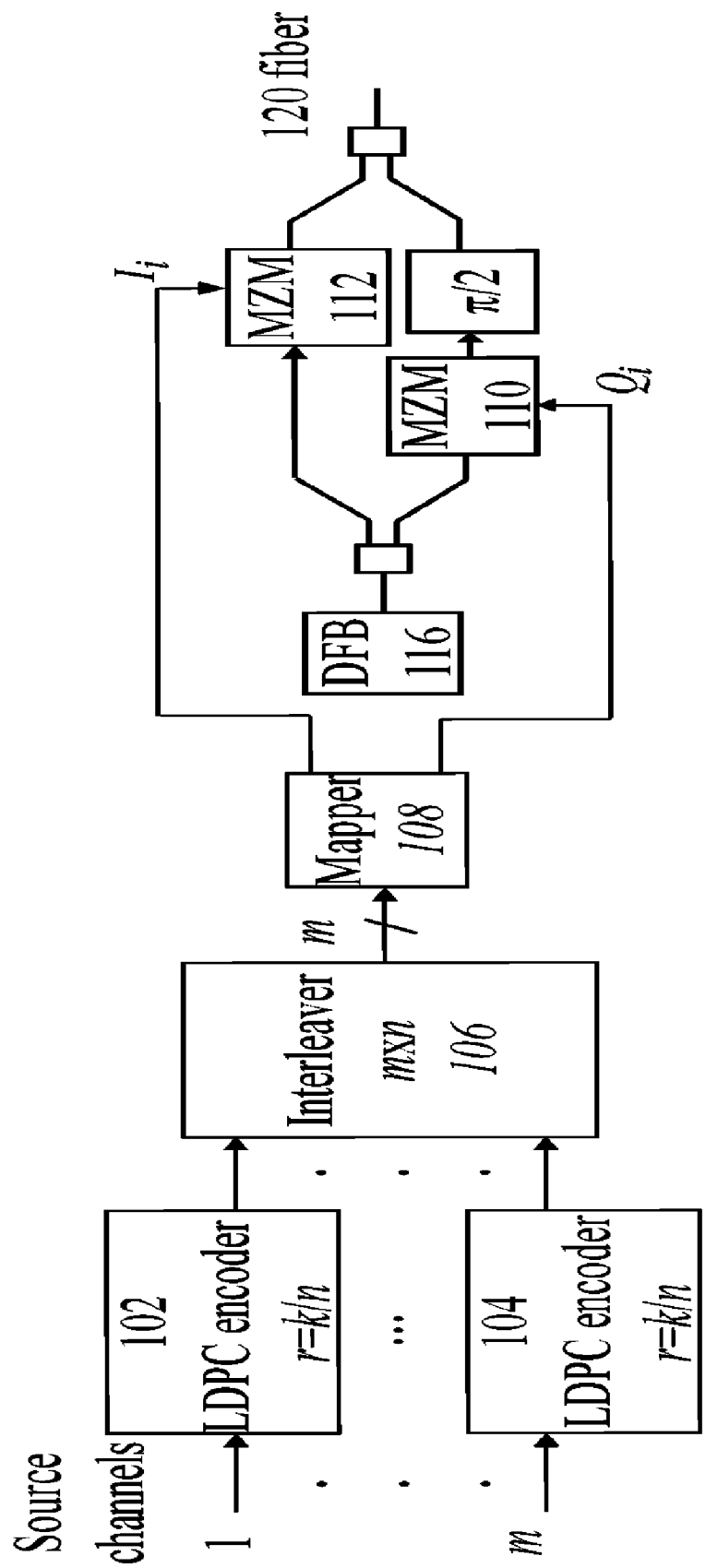
FIG. 2 shows a transmitter architecture for a bit-interleaved-coded-modulation LDPC-coded modulation scheme.

FIG. 2 shows a transmitter architecture for a bit-interleaved LDPC-coded modulation scheme in combination with the coherent detection scheme. In FIG. 2, source bit streams are provided to LDPC encoders 102 which are connected to an interleaver 106. The output of interleaver 106 is provided to mapper 108 which in turn communicates with MZM 110 and 112. MZM 110-112 also receive data from DFB 116 through splitter 118. The output of MZM 112 is sent directly to port 120, while the output of MZM 110 is phase shifted for $\pi/2$ radians before being sent to port120.

Figure 3:
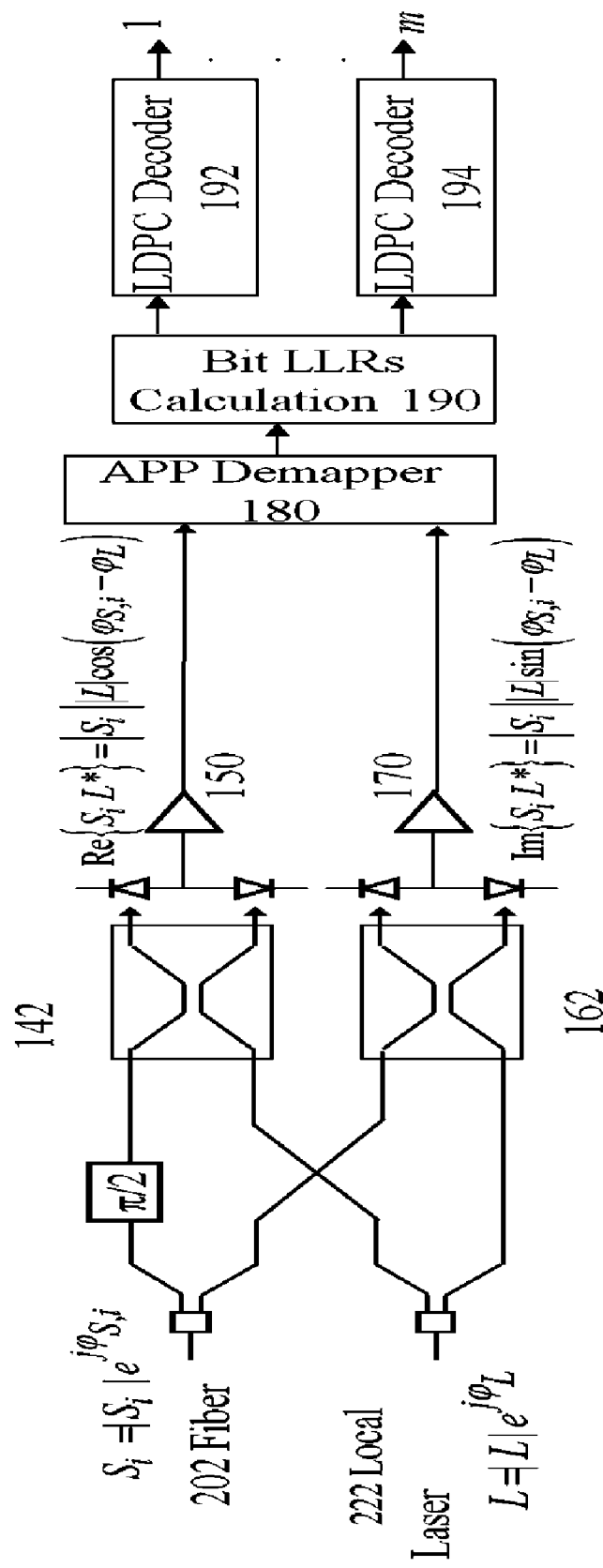
FIG. 3 shows an exemplary direct detection reference case for the bit-interleaved LDPC-coded modulation scheme.
Figure 4:
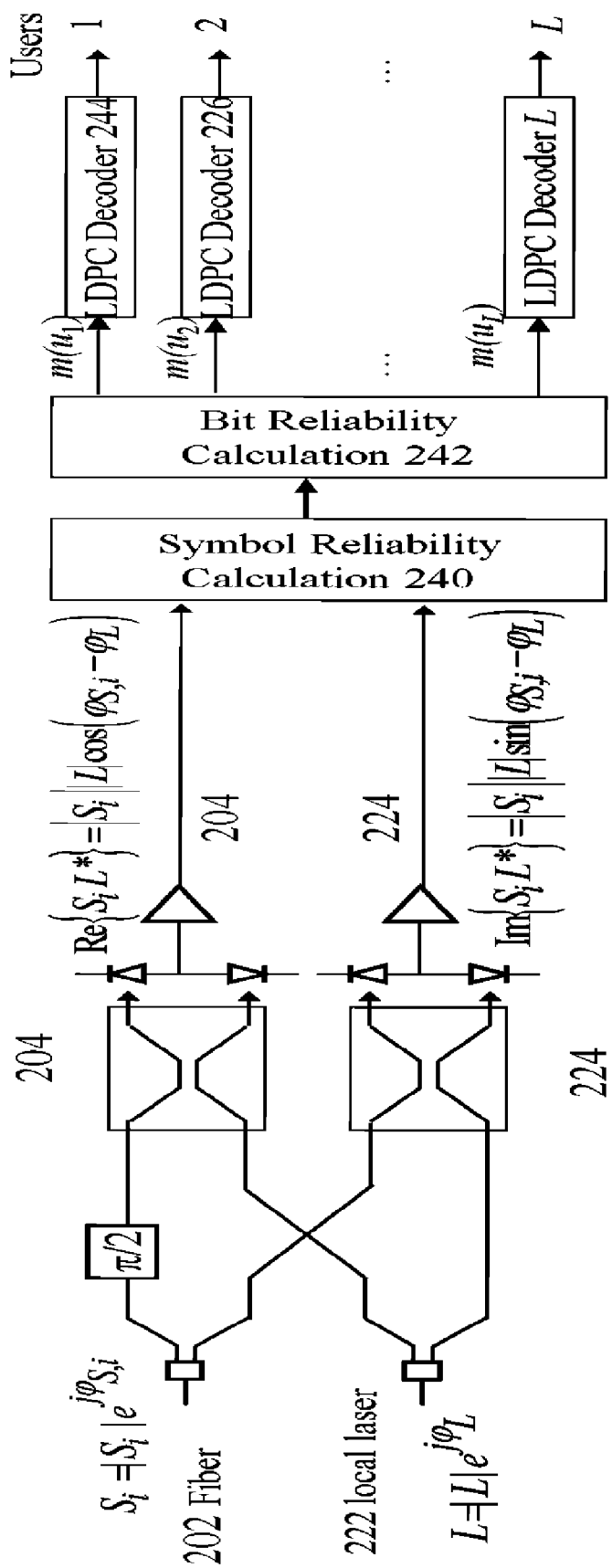
FIG. 4 shows a coherent detection receiver architecture for the bit-interleaved LDPC-coded modulation scheme.

In FIGS. 2-4, $Ts=1/Rs$, Rs is the symbol rate. The source bit streams coming from m information sources (e.g., carrying 40 Gb/s traffic) are encoded by using identical (n,k) LDPC encoders 102-104 with codes of code rate $r=k/n$ (k-the number of information bits, n-the codeword length). The LDPC decoder outputs are written to the m×n block-interleaver 106 row-wise. A mapper 108 accepts m bits, $c=(c_1, c_2, \ldots, c_m)$, at time instance i from the (m×n) interleaver 106 column-wise and determines the corresponding M-ary ($M=2^m$) constellation point $s_i=(I_i,Q_i)=|s_i|\exp(j\phi_i)$. In coherent detection case the data phasor $\phi_i \in \{0, 2\pi/M, \ldots, 2\pi(M-1)/M\}$ is sent at each $i^{th}$ transmission interval. On the other side, in direct detection, which serves here as a reference case, the differential encoding is required so that the data phasor $\phi_i=\phi_{i-1}+\Delta\phi_i$, where $\Delta\phi_i \in \{0, 2\pi/M, \ldots, 2\pi(M-1)/M\}$, is sent instead at each $i^{th}$ transmission interval.

FIG. 3 shows an exemplary direct detection reference case for the bit-interleaved LDPC-coded modulation scheme. Referring now to FIG. 3, a direct detection receiver architecture is shown. Data from fiber input port 202 is provided to 3-dB coupler blocks 142 and 162. Data from block 142 is received by block 144, and similarly data from block 162 is received by block 164. Block 142 is connected to balanced photodiodes and receiver 150. Similarly, block 164 is connected to balanced photodiodes and receiver 170. The outputs of balanced receivers 150 and 170 are processed by an APP demapper 180. The demapped information is sent to a bit LLR calculation module 190, and the data stream is generated by one or more LDPC decoders 192-194.

The receiver input electrical field at time instance i for an optical M-ary differential phase-shift keying (DPSK) receiver configuration from FIG. 3 is denoted by $E_i=|E_i|\exp(j\phi_i)$. The outputs of I- and Q-branches (upper and lower-branches in FIG. 3) are proportional to $Re\{E_i E^*_{i-1}\}$ and $Im\{E_i E^*_{i-1}\}$, respectively.

FIG. 4 shows a coherent detection receiver architecture for the bit-interleaved LDPC-coded modulation scheme. In this embodiment, signal S from the fiber is received at port 202 while a local laser signal is received at port 222. The fiber port signal is phase shifted by $\pi/w$ radians and provided to 3-dB coupler block 204. Block 204 also receives signals from port 222. Block 224 receives signals from ports 202 and 222. The outputs of blocks 204 and 224 are provided to receivers 216 and 236, respectively. Receiver 216 has photodiodes connected thereto, and similarly receiver 236 has photodiodes connected thereto. The outputs of receivers 204 and 224 are provided to an APP demapper 240. The demapper 240 sends the demapped information to a bit-LLR calculator 242. LDPC decoders 244-246 then process the information from the bit LLR calculator 242 as decoded output data.

In the corresponding coherent detector receiver architecture shown in FIG. 4, $S_i=|S|e^{j\phi_{S,i}}(\phi_{S,i}=\omega_S t+\phi_i+\phi_{S,PN})$ is coherent receiver input electrical field at time instance i, while $L=|L|e^{j\phi_L}(\phi_L=\omega_L t+\phi_{L,PN})$ is the local laser electrical field. For homodyne detection the frequency of the local laser ($\omega_L$) is the same as that of the incoming optical signal ($\omega_L$), so the balanced outputs of I- and Q-channel branches (upper- and lower-branches of FIG. 4) can be written as $$v_I(t)=R|S_k||L|\cos(\phi_i+\phi_{S,PN}-\phi_{L,PN}) \; (i-1)T_s \leq t < iT_s$$

$$v_Q(t)=R|S_k||L|\sin(\phi_i+\phi_{S,PN}-\phi_{L,PN}) \; (i-1)T_s \leq t < iT_s \qquad (1)$$

where R is photodiode responsivity, while $\phi_{S,PN}$ and $\phi_{L,PN}$ represent the laser phase noise of transmitting and receiving (local) laser, respectively. These two noise sources are commonly modeled as Wiener-Lévy process, which is a zero-mean Gaussian process with variance $2\pi(\Delta v_S+\Delta v_L)|t|$, where $\Delta v_S$ and $\Delta v_L$ are the laser linewidths of transmitting and receiving laser, respectively. The transmitted signal constellation point $s_i=|s_i|\exp(j\phi_i)$ can be perfectly recovered in accordance with Eqn (1) only in the absence of laser phase noise. The outputs at I- and Q-branches (in either coherent or direct detection case), are sampled at the symbol rate, while the symbol log-likelihood ratios (LLRs) are calculated in a posteriori probability (APP) demapper block as follows $$\lambda(s) = \log\frac{P(s = s_0 \mid r)}{P(s \neq s_0 \mid r)}, \quad (2)$$

where P(s|r) is determined by using Bayes' rule $$P(s \mid r) = \frac{P(r \mid s)P(s)}{\sum_{s'} P(r \mid s')P(s')}. \quad (3)$$

where $s=(I_i,Q_i)$ (as mentioned earlier) is the transmitted signal constellation point at time instance i, while $r=(r_I,r_Q)$, $r_I=v_I(t=iT_s)$, and $r_Q=v_Q(t=iT_s)$ are the samples of I- and Q-detection branches from FIGS. 2 and 3. P(r|s) from Eqn. (3) is estimated by evaluation of histograms, employing sufficiently long training sequence. With P(s) the a priori probability of symbol is denoted s, while $s_0$ is a referent symbol. Normalization in (2) is introduced to equalize denominator from (3). The bit LLRs $c_j$ (j=1, 2, ..., m) are determined from symbol LLRs of Eqn. (2) as $$L(\hat{c}_j) = \log\frac{\sum_{s:c_j=0}\exp[\lambda(s)]}{\sum_{s:c_j=1}\exp[\lambda(s)]}. \quad (4)$$

The APP demapper extrinsic LLRs (the difference of demapper bit LLRs and LDPC decoder LLRs from previous step) for LDPC decoders become $$L_{M,e}(\hat{c}_j)=L(\hat{c}_j)-L_{D,e}(c_j). \quad (5)$$

The $L_{D,e}(c)$ the LDPC decoder extrinsic LLRs is initially set to zero value. The LDPC decoder is implemented by employing the sum-product algorithm. The LDPC decoders extrinsic LLRs (the difference between LDPC decoder output and input LLRs), $L_{D,e}$, are forwarded to the APP demapper as a priori bit LLRs ($L_{M,a}$), so that the symbol a priori LLRs are calculated as $$\lambda_a(s) = \log P(s) = \sum_{j=0}^{m-1}(1-c_j)L_{D,e}(c_j). \quad (6)$$

By substituting Eqn. (6) into Eqn. (3) and then Eqn (2), the system calculates the symbol LLRs for the subsequent iteration. The iteration between the APP demapper and LDPC decoder is performed until the maximum number of iterations is reached, or the valid code-words are obtained.

Figure 5:
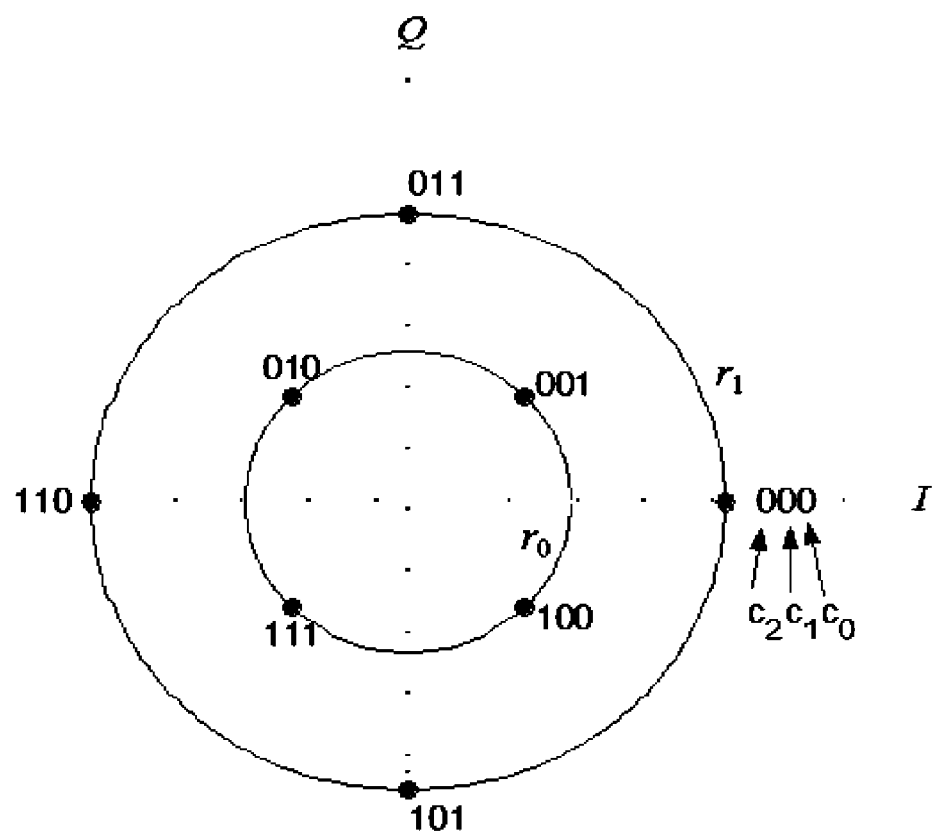
Figure 6:
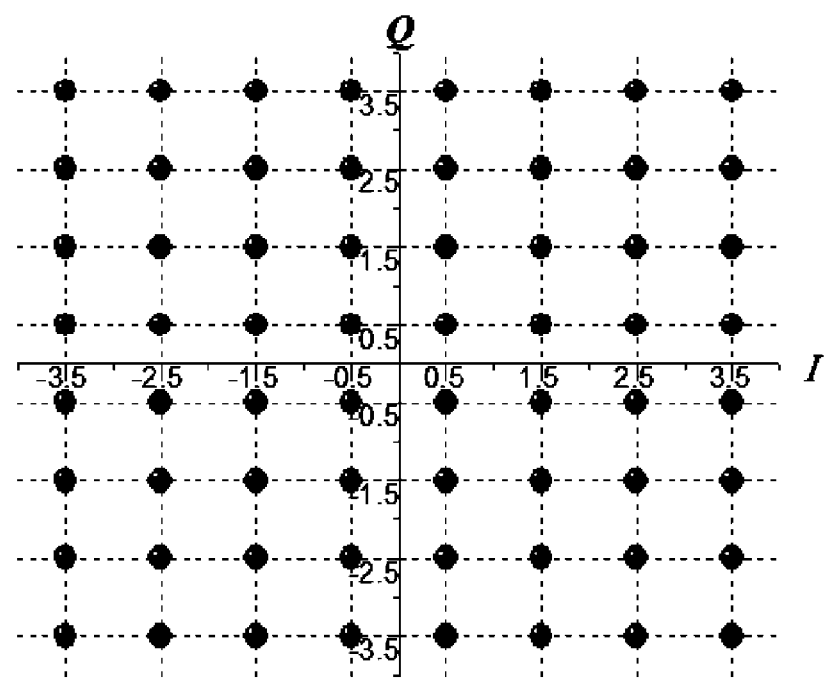
FIG. 6 shows an exemplary 64-QAM constellation diagram.

FIG. 5 shows an exemplary constellation diagram for 8-QAM, while FIG. 6 shows an exemplary 64-QAM constellation diagram. With 8-QAM the system can achieve 120-Gb/s aggregate rate, and with 64-QAM 240-Gb/s, while the transmission symbol rate is 40-Giga symbols/s.

Figure 7:
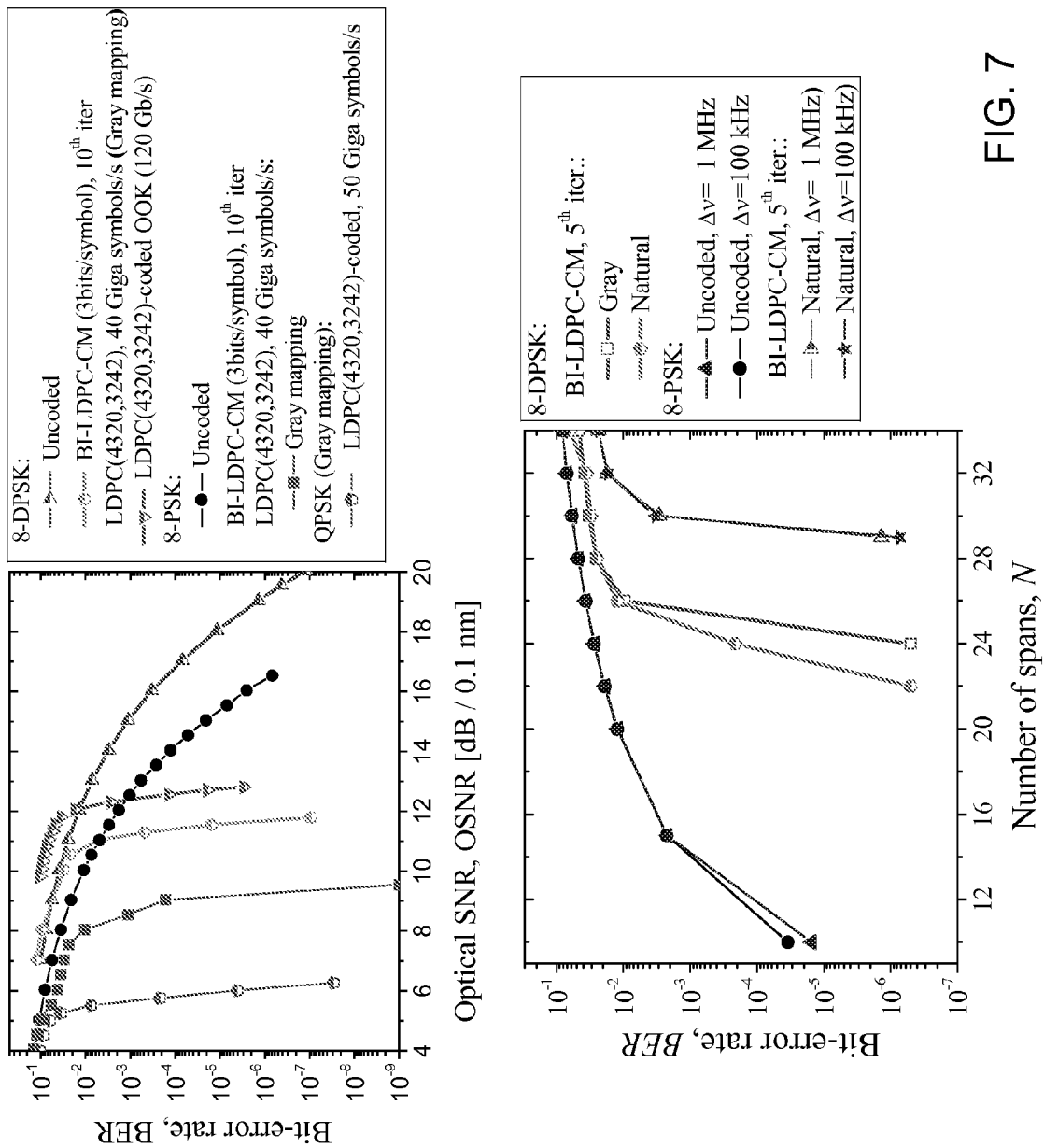
FIG. 7 shows exemplary BER performance of the BI-LDPC-CM/coherent detection scheme.

FIGS. 7(a)-(b) show an exemplary chart illustrating BER performance of BI-LDPC-CM/coherent detection scheme. FIG. 7(a) shows the BER on an AWGN channel model for 8-PSK, while FIG. 7(b) shows the BER for an exemplary dispersion map. The results of simulations for 30 iterations in the sum-product algorithm and for an additive Gaussian noise (AWGN) channel model and 8-DPSK/8-PSK schemes are shown in FIG. 7(a). The information symbol rate is set to 40 Gsymbols/s, while 8-DPSK/8-PSK is employed in simulations, which produces an aggregate bit rate of 120 Gb/s. Two different mappers are considered: Gray, and natural mapping. The expected coding gain for 8-DPSK at BER of $10^{-12}$, obtained by extrapolation, is about 12.8 dB. The line rate of considered scheme is 53.4 Gsymbols/s. The coherent detection scheme provides an additional improvement of about 2.5 dB.

The results of Monte Carlo simulations for the dispersion map described below are shown in FIG. 7(b). The dispersion map under consideration has N spans of total length L=120 km, where each span consists of 2 L/3 km of D+ fiber followed by L/3 km of D− fiber. The pre-compensation of −1600 ps/nm is also employed. The simulations were carried out with the average transmitted power per symbol of 0 dBm, the central wavelength is set to 1552.524 nm, while 8-DPSK/8-PSK with RZ pulses of duty cycle 33% are considered. The propagation of a signal is modelled by the nonlinear Schrödinger equation. The effects of self-phase modulation, nonlinear phase-noise, intrachannel cross-phase modulation, intrachannel four-wave mixing, stimulated Raman scattering, chromatic dispersion, laser phase noise, ASE noise and intersymbol interference are all taken into account. While, by using BI-LDPC-CM and direct detection in a point-to-point transmission scenario it was possible to achieve the transmission distance of 2760 km at 120 Gb/s aggregate rate with LDPC codes with BER threshold of $10^{-2}$, the coherent detection scheme is able to extend the transmission distance by about 600 km. It was shown that laser phase noise did not have a major impact on transmission performance.

The coherent detection outperforms corresponding direct detection scheme by achieving an additional margin of 2.5 dB. This is very significant result from optical networking perspective for transmission in an all-optical environment where a number of reconfigurable optical add-drop muxes (ROADM) and/or wavelength crossconnects (WXC) may be employed at the wavelength path. An additional margin created by employment of coherent detection scheme is assumed to be enough to keep the same distance as one attributed to direct detection scheme in point-to point transmission scenario, but this time with inclusion of all optical networking constraints, i.e. penalties due to deployment of ROADMs and WXC.

Ultra high-speed transmission architecture, which employs a bandwidth-efficient LDPC-coded modulation, BI-LDPC-CM, and coherent detection scheme, has been proposed. In this architecture the aggregate bit rate above 100 Gb/s is maintained, while modulation, coding, signal processing, and transmission are done at 40 Gb/s, which makes the implementation easier, and the impact of nonlinearities and PMD is less important. Moreover, once the ETDM technology at 100 Gb/s becomes mature enough, the schemes considered in this paper can be used to achieve transmission at much higher rates that 100 Gb/s. It was found that the coherent detection scheme outperforms the direct detection one by enabling an additional 2.5 dB margin to be used either to extend the transmission distance by more than 20%, or to compensate for penalties due to networking effects in an all optical network deployment scenario.

The foregoing detailed description is to be understood as being in every respect illustrative and exemplary, but not restrictive, and the scope of the invention disclosed herein is not to be determined from the description of the invention, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

What is claimed is:

1. An optical communication system with M-ary two-dimensional signal constellations, comprising:
    $\log_2(M)$ parallel low-density parity-check (LDPC) encoders to generate codes used as component codes, where M is an even number greater than three; and
    a bit-interleaved coded modulation (BICM) encoder coupled to each LDPC encoder to generate signals for a remote optical coherent detector.

2. The system of claim 1, wherein each LDPC encoder comprises identical (n,k) LDPC codes of code rate r=k/n, wherein k is the number of information bits and n is the codeword length.

3. The system of claim 1, comprising a block interleaver coupled to each LDPC encoder.

4. The system of claim 2, wherein each LDPC encoder outputs are written to the block-interleaver row-wise.

5. The system of claim 3, comprising a mapper coupled to the block interleaver.

6. The system of claim 5, wherein the block interleaver comprises an (m×n) interleaver and the mapper accepts m bits, $c=(c_1, c_2, \ldots, c_m)$, at time instance i from the (m×n) interleaver column-wise and determines a corresponding M-ary ($M=2^m$) constellation point.

7. The system of claim 1, a wherein the coherent detector includes a coherent transmitter.

8. The system of claim 7, wherein the coherent transmitter sends constellation coordinates from the mapper at each $i^{th}$ transmission interval.

9. The system of claim 7, wherein the coherent transmitter performs differential encoding.

10. The system of claim 7, comprising an a posteriori probability (APP) demapper block.

11. The system of claim 7, comprising a log-likelihood ratio (LLR) module coupled to the APP demapper block.

12. The system of claim 11, comprising LDPC decoders coupled to the LLR module.

13. A method to perform optical communication with M-ary signal constellations, comprising:
    applying bit-interleaved coded modulation (BICM) coding and a $\log_2(M)$ parallel low-density parity-check (LDPC) coding to generate codes used as component codes to generate a BI-LDPC code modulation to be received by a remote optical coherent detector, where M is an even number greater than three; and
    performing bit-interleaved coded modulation (BICM) encoder to generate signals for the remote optical coherent detector.

14. The method of claim 13, wherein the LDPC coding comprises identical (n,k) LDPC codes of code rate r=k/n, wherein k is the number of information bits and n is the codeword length.

15. The method of claim 13, comprising block interleaving the LDPC codes into an (m×n) interleaved block and the mapping m bits, $c=(c_1, c_2, \ldots, c_m)$, at time instance i from the (m×n) interleaved block column-wise and determining a corresponding M-ary ($M=2^m$) constellation point.

16. The method of claim 13, comprising to receiving a BI-LDPC coded modulation at a coherent detector receiver.

17. The method of claim 16, wherein the coherent detector receiver sends a given signal constellation point coordinates at each $i^{th}$ transmission interval.

18. The method of claim 16, wherein the coherent detector performs differential decoding.

19. The method of claim 16, comprising performing an a posteriori probability (APP) demapping.

20. The method of claim 16, comprising determining a log-likelihood ratio (LLR) from the APP demapping.

21. The method of claim 20, comprising performing LDPC decoding from LLR information.

* * * * *